(12) United States Patent
Ishimura et al.

(10) Patent No.: US 7,791,104 B2
(45) Date of Patent: Sep. 7, 2010

(54) OPTICAL SEMICONDUCTOR DEVICE

(75) Inventors: Eitaro Ishimura, Tokyo (JP);
Yoshikazu Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 465 days.

(21) Appl. No.: 11/874,980

(22) Filed: Oct. 19, 2007

(65) Prior Publication Data
US 2008/0303059 A1 Dec. 11, 2008

(30) Foreign Application Priority Data
Jun. 5, 2007 (JP) .............................. 2007-149591

(51) Int. Cl.
*H01L 31/304* (2006.01)
(52) U.S. Cl. ..................................... 257/186
(58) Field of Classification Search ............... 257/13, 257/79–103, 116, 117, 186, 432–437, 749, 257/918, E33.001–E33.077, E25.028, E25.032, 257/E51.018–E51.022; 438/22–47, 69, 493, 438/507, 956
See application file for complete search history.

(56) References Cited

U.S. PATENT DOCUMENTS

| | | | |
|---|---|---|---|
| 5,365,087 A | | 11/1994 | Sasaki |
| 6,204,512 B1 * | | 3/2001 | Nakamura et al. ............. 257/13 |
| 6,388,275 B1 * | | 5/2002 | Kano .......................... 257/94 |
| 6,603,152 B2 * | | 8/2003 | Song et al. .................... 257/99 |
| 6,610,995 B2 * | | 8/2003 | Nakamura et al. ............. 257/13 |
| 6,777,805 B2 * | | 8/2004 | Uemura et al. ............... 257/745 |
| 6,858,873 B2 * | | 2/2005 | Lee .............................. 257/81 |
| 7,291,865 B2 * | | 11/2007 | Kojima et al. ................. 257/98 |
| 7,683,381 B2 * | | 3/2010 | Hsu et al. ...................... 257/81 |
| 2002/0047128 A1 * | | 4/2002 | Song et al. .................... 257/82 |
| 2005/0211989 A1 * | | 9/2005 | Horio et al. ................... 257/79 |
| 2009/0137076 A1 * | | 5/2009 | Watanabe et al. ............. 438/29 |

FOREIGN PATENT DOCUMENTS

| | | |
|---|---|---|
| JP | 61-289677 | 12/1986 |
| JP | 6-37292 | 2/1994 |
| JP | 10-209486 | 8/1998 |

* cited by examiner

*Primary Examiner*—Dao H Nguyen
*Assistant Examiner*—Tram H Nguyen
(74) *Attorney, Agent, or Firm*—Leydig, Voit & Mayer, Ltd.

(57) ABSTRACT

An n-type InGaAs light absorbing layer and an n-type InP layer (first conductivity type semiconductor layer), which is a window layer, and a multiplication layer are multilayered one atop another on an n-type InP substrate. By selectively diffusing impurities and implanting ions, a p-type InP region second conductivity type semiconductor region) is formed on a part of the top surface of the n-type InP layer. The top surfaces of the n-type InP layer and p-type InP region are covered with a surface protection film. A cathode electrode (first electrode) is connected to the underside of the n-type InP substrate. A ring-shaped anode electrode (second electrode) is connected to the top surface of the p-type InP region. A low-voltage electrode surrounds the anode electrode. A voltage lower than that of the cathode electrode his applied to this low-voltage electrode.

12 Claims, 18 Drawing Sheets

OPTICAL SEMICONDUCTOR DEVICE

BACKGROUND OF THE INVENTION

1. Field of the Invention

The present invention relates to an optical semiconductor device such as an avalanche photodiode for optical communication, and more particularly, to an optical semiconductor device capable of improving an anti-moisture property.

2. Background Art

FIG. 18 is a perspective view showing a conventional optical semiconductor device. This optical semiconductor device is an avalanche photodiode for optical communication (e.g., see Japanese Patent Laid-Open No. 10-209486).

An n-type InGaAs light absorbing layer 12, an n-type InP layer 13 which is a window layer and a multiplication layer are multilayered one atop another on an n-type InP substrate 11. By selectively diffusing impurities and implanting ions, a p-type InP region 14 is formed on a part of the top surface of the n-type InP layer 13. The top surfaces of the n-type InP layer 13 and the p-type InP region 14 are covered with a surface protection film 15. A cathode electrode 16 is connected to the underside of the n-type InP substrate 11. A ring-shaped anode electrode 17 is connected to the top surface of the p-type InP region 14. The region surrounded by this anode electrode 17 is a light receiving section 18.

Next, the operation of the above described optical semiconductor device will be explained. A voltage lower than that of the cathode electrode 16 is applied to the anode electrode 17. That is, a reverse bias is applied between the anode electrode 17 and the cathode electrode 16. This reverse bias (operating voltage) is adjusted to be approximately 90% of a breakdown voltage. Since the breakdown voltage is quite high on the order of 20 to 80 V, the reverse bias is as high as a maximum of approximately 70 V.

A light signal enters the light receiving section 18 from above in the figure. Since a p-type InP layer 63 has a large band gap, it allows light of a wavelength (1.3 µm and 1.55 µm) which is used in normal optical communication to pass without absorbing it. The light which has passed is absorbed by the n-type InGaAs light absorbing layer 12 having a small band gap, producing electrons and holes. These holes move through a depletion layer, enter the n-type InP layer 13 to which a high electric field is applied, provokes avalanche multiplication under such a high electric field and produces many new electrons and holes. As a result, a light signal is extracted from the optical semiconductor device as a multiplied current signal. This allows a signal having a current value more than ten times that when no multiplication occurs.

SUMMARY OF THE INVENTION

Many parts such as a chip capacitor, metal wire, preamplifier, resistor, carrier are used around an optical semiconductor device and a package such as a stem is also used to mount the optical semiconductor device. Not a small number of charged ions are adhered to these members. These charged ions have the property of being attracted to where a voltage is applied. Therefore, positive ions are attracted around the anode electrode 17 to which a negative bias is applied. This causes a leakage current to start to flow through the surface of the chip. As a result, a current flows from the anode electrode 17 to the n-type InP layer 13.

When the optical semiconductor device is used in a high humidity atmosphere, a leakage current flows through the chip top surface with moisture and causes corrosion. This corrosion corrodes the surface protection film 15 and causes the electric current to further increase. As a result, discolored and degraded parts 101 are produced on the chip top surface. This discoloration occurs from the end of the surface protection film 15 toward the anode electrode 17. Furthermore, discoloration may also develop toward the periphery from the anode electrode 17 as a starting point. The advance of this discoloration eventually results in a problem of producing short-circuits and openings.

Therefore, the conventional optical semiconductor device cannot be used in an atmosphere with high humidity. Furthermore, even when the optical semiconductor device is hermetically sealed with a cap or the like, strict control is required so that no moisture infiltrates into the cap.

The present invention has been implemented to solve the above described problems and it is an object of the present invention to obtain an optical semiconductor device capable of improving an anti-moisture property.

According to one aspect of the present invention, an optical semiconductor device comprising: a first conductive type semiconductor layer; a second conductive type semiconductor region formed on a part of a top surface of the first conductive type semiconductor layer; a surface protection film which covers top surfaces of the first conductive type semiconductor layer and the second conductive type semiconductor region; a first electrode connected to the first conductive type semiconductor layer; a second electrode which is connected to the second conductive type semiconductor region and to which a voltage lower than that of the first electrode is applied; and a low-voltage electrode which is arranged so as to surround the second electrode and to which a voltage lower than that of the first electrode is applied.

The present invention can improve an anti-moisture property.

Other and further objects, features and advantages of the invention will appear more fully from the following description.

DETAILED DESCRIPTION OF THE PREFERRED EMBODIMENTS

Embodiment 1

Figure 1:
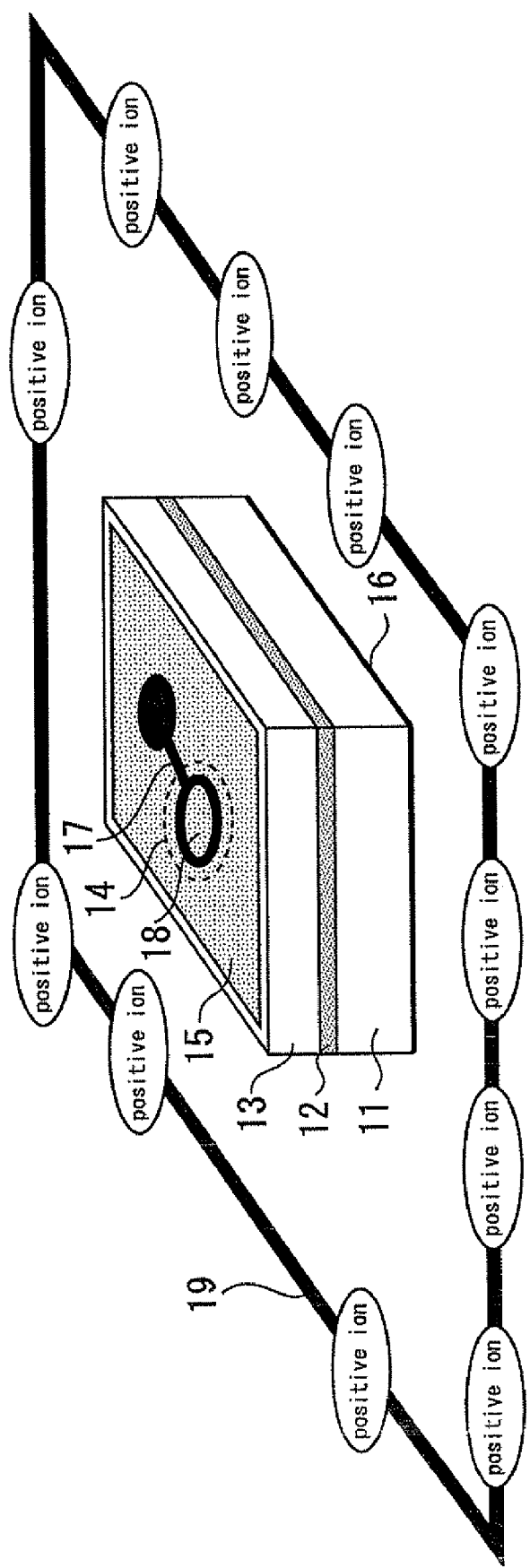
FIG. 1 is a perspective view showing an optical semiconductor device according to Embodiment 1 of the present invention.

FIG. 1 is a perspective view showing an optical semiconductor device according to Embodiment 1 of the present invention. This optical semiconductor device is an avalanche photodiode for optical communication.

An n-type InGaAs light absorbing layer 12 and an n-type InP layer 13 (first conductive type semiconductor layer) which is a window layer and a multiplication layer are multilayered one atop another on an n-type InP substrate 11. By selectively diffusing impurities and implanting ions, a p-type InP region 14 (two-conductive type semiconductor region) is formed on a part of the top surface of the n-type InP layer 13. The top surfaces of the n-type InP layer 13 and the p-type InP region 14 are covered with a surface protection film 15. A cathode electrode 16 (first electrode) is connected to the underside of the n-type InP substrate 11. A ring-shaped anode electrode 17 (second electrode) is connected to the top surface of the p-type InP region 14. The region surrounded by this anode electrode 17 is a light receiving section 18. A voltage lower than that of the cathode electrode 16 is applied to the anode electrode 17.

In this embodiment, a low-voltage electrode 19 is arranged so as to surround the anode electrode 17. A voltage lower than that of the cathode electrode 16 is applied to this low-voltage electrode 19. This causes positive ions which exist around the optical semiconductor device to be trapped by the low-voltage electrode 19 and prevents positive ions from gathering around the anode electrode 17. Therefore, discoloration and degradation are less likely to occur and the anti-moisture property can thereby be improved.

Figure 2:
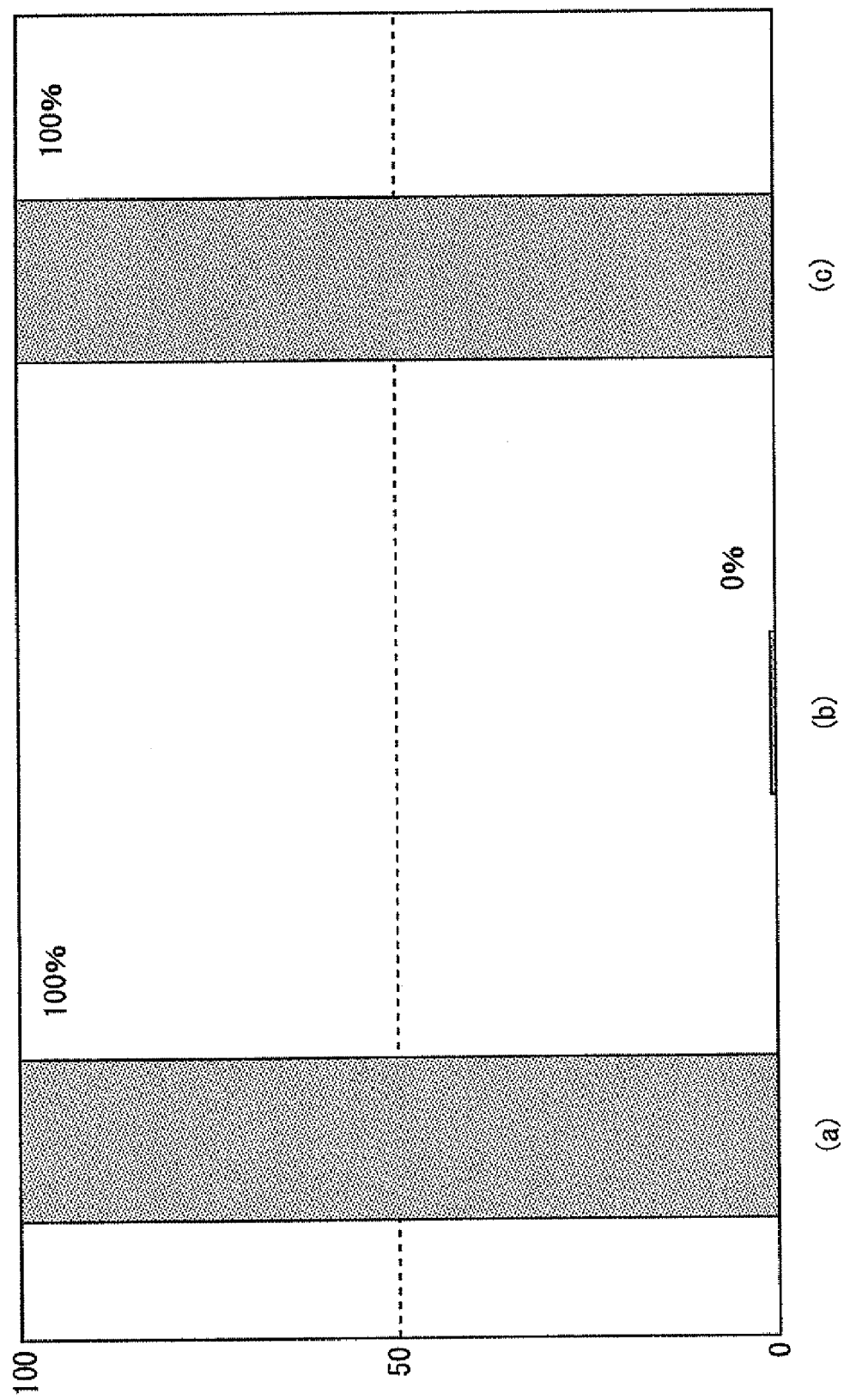
FIG. 2 shows the result of measurement of the proportion of elements which have discolored and degraded by changing the voltage applied to the low-voltage electrode.

FIG. 2 shows the result of measurement of the proportion of elements which have discolored and degraded by changing the voltage applied to the low-voltage electrode. As the experiment conditions, the temperature was set to 85° C., humidity set to 85% and a voltage of 90% of a breakdown voltage was applied between the anode electrode 17 and the cathode electrode 16. As a result of the experiment, 100% of elements discolored and degraded in the case (a) where no voltage was applied to the low-voltage electrode 19 and in the case (c) where a voltage higher than that of the cathode electrode 16 was applied. On the other hand, in the case (b) where a voltage lower than that of the cathode electrode 16 was applied to the low-voltage electrode 19, 0% of elements discolored and degraded. From this experiment result, it was confirmed that this embodiment can prevent discoloration and degradation.

In FIG. 1, the entire perimeter of the chip of the optical semiconductor device is surrounded by the low-voltage electrode 19, but a similar effect can also be obtained by not necessarily surrounding the entire perimeter. Furthermore, a similar effect can also be obtained by surrounding the perimeter of the anode electrode 17 with the low-voltage electrode 19 without surrounding the entire chip.

Embodiment 2

Figure 3:
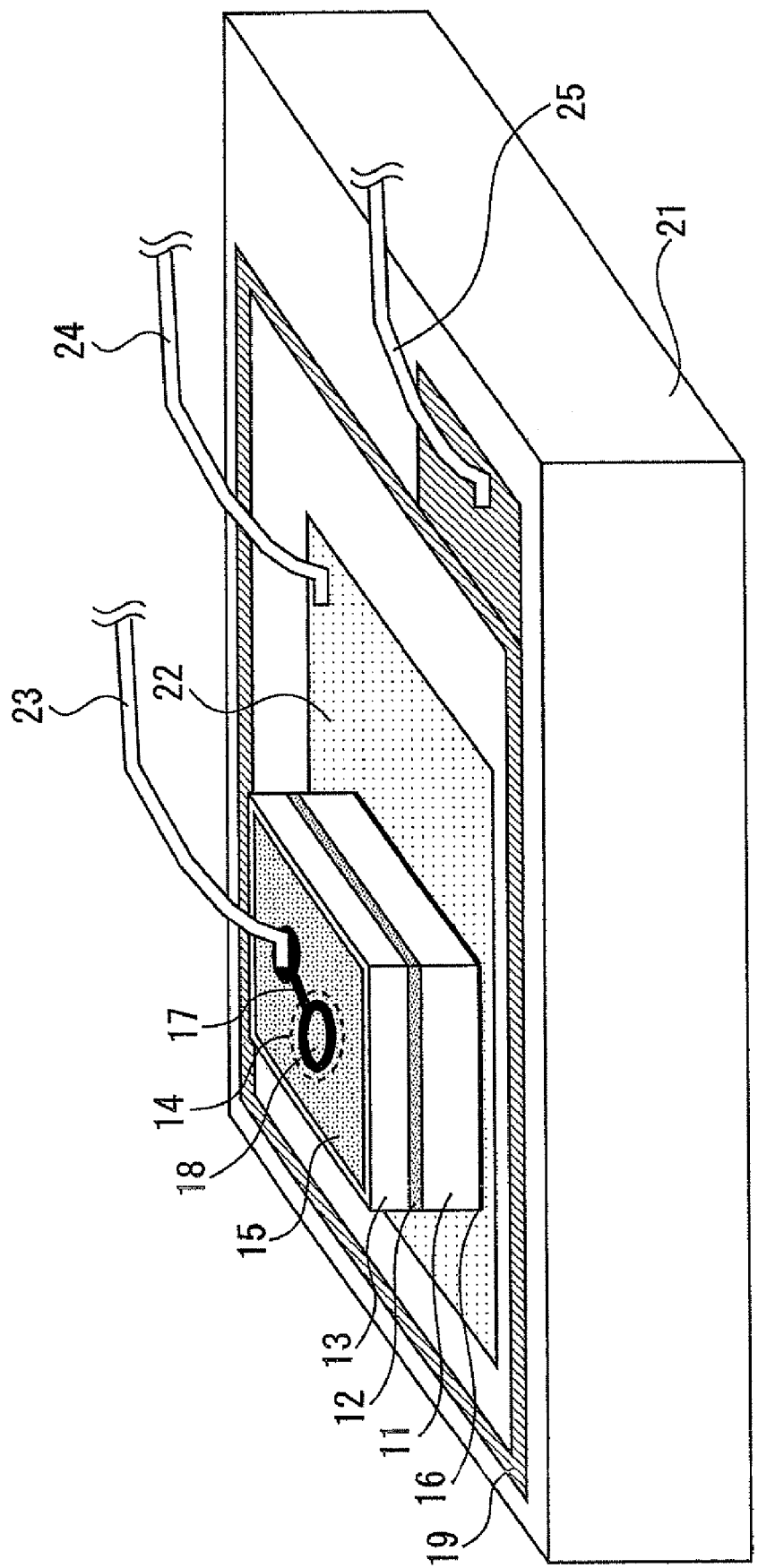
FIG. 3 is a perspective view showing an optical semiconductor device according to Embodiment 2 of the present invention.

FIG. 3 is a perspective view showing an optical semiconductor device according to Embodiment 2 of the present invention. An optical semiconductor device chip similar to that of Embodiment 1 is mounted on an insulative pedestal 21. A pedestal side electrode 22 of the pedestal 21 has contact with a cathode electrode 16 of the optical semiconductor device. A low-voltage electrode 19 is arranged on the pedestal 21 so as to surround the pedestal side electrode 22. An anode electrode 17, the pedestal side electrode 22, the low-voltage electrode 19 are electrically connected to an outside circuit (not shown) through wires 23, 24, 25 respectively.

A voltage lower than that of the pedestal side electrode 22 is applied to the low-voltage electrode 19. This causes positive ions on and around the pedestal 21 to be attracted to the low-voltage electrode 19, and therefore positive ions attracted to the anode electrode 17 are reduced. Therefore, discoloration and degradation are less likely to occur and the anti-moisture property thereof can be improved.

In FIG. 3, the entire perimeter of the pedestal side electrode 22 is surrounded by the low-voltage electrode 19, but a similar effect can also be obtained without necessarily surrounding the entire perimeter.

Embodiment 3

Figure 4:
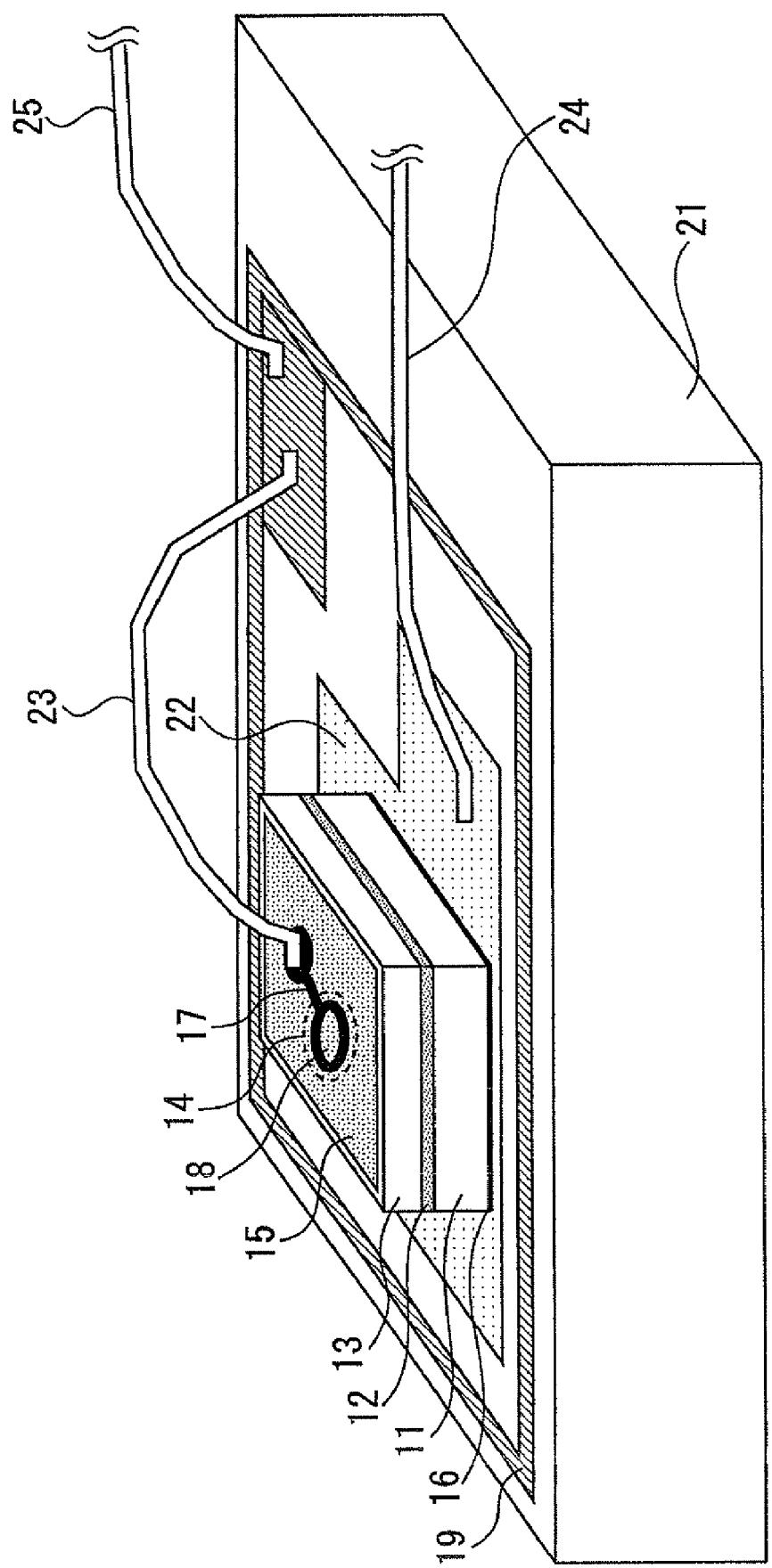
FIG. 4 is a perspective view showing an optical semiconductor device according to Embodiment 3 of the present invention.

FIG. 4 is a perspective view showing an optical semiconductor device according to Embodiment 3 of the present invention. An anode electrode 17 and a low-voltage electrode 19 are electrically connected by a wire 23. The rest of the configuration is the same as that in Embodiment 2. This eliminates the necessity for a power supply to make the voltage of the low-voltage electrode 19 lower than the voltage of a cathode electrode 16.

Embodiment 4

Figure 5:
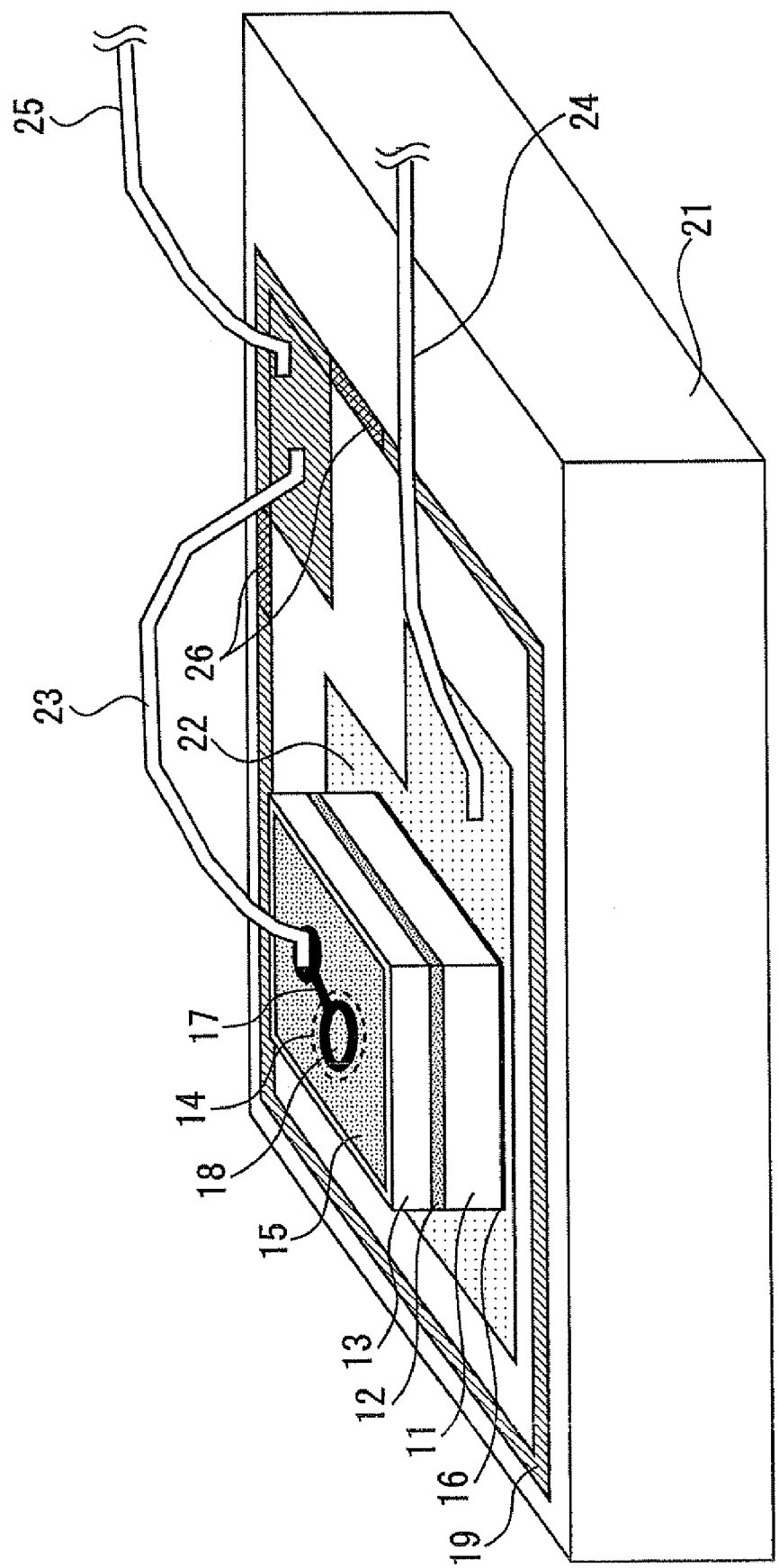
FIG. 5 is a perspective view showing an optical semiconductor device according to Embodiment 4 of the present invention.

FIG. 5 is a perspective view showing an optical semiconductor device according to Embodiment 4 of the present invention. A high impedance section 26 is connected between an anode electrode 17 and a low-voltage electrode 19. This high impedance section 26 is made of a thin film resistor, chip resistor, inductor, chip inductor or the like and the impedance thereof is equal to or more than 20Ω. However, the impedance of the high impedance section 26 is preferably equal to or more than 200 to 300Ω. The rest of the configuration is the same as that in Embodiment 3. Providing the high impedance section 26 in this way can prevent a high frequency signal outputted from the anode electrode 17 from leaking out to the low-voltage electrode 19. As a result, the high frequency response of the optical semiconductor device improves.

Embodiment 5

Figure 6:
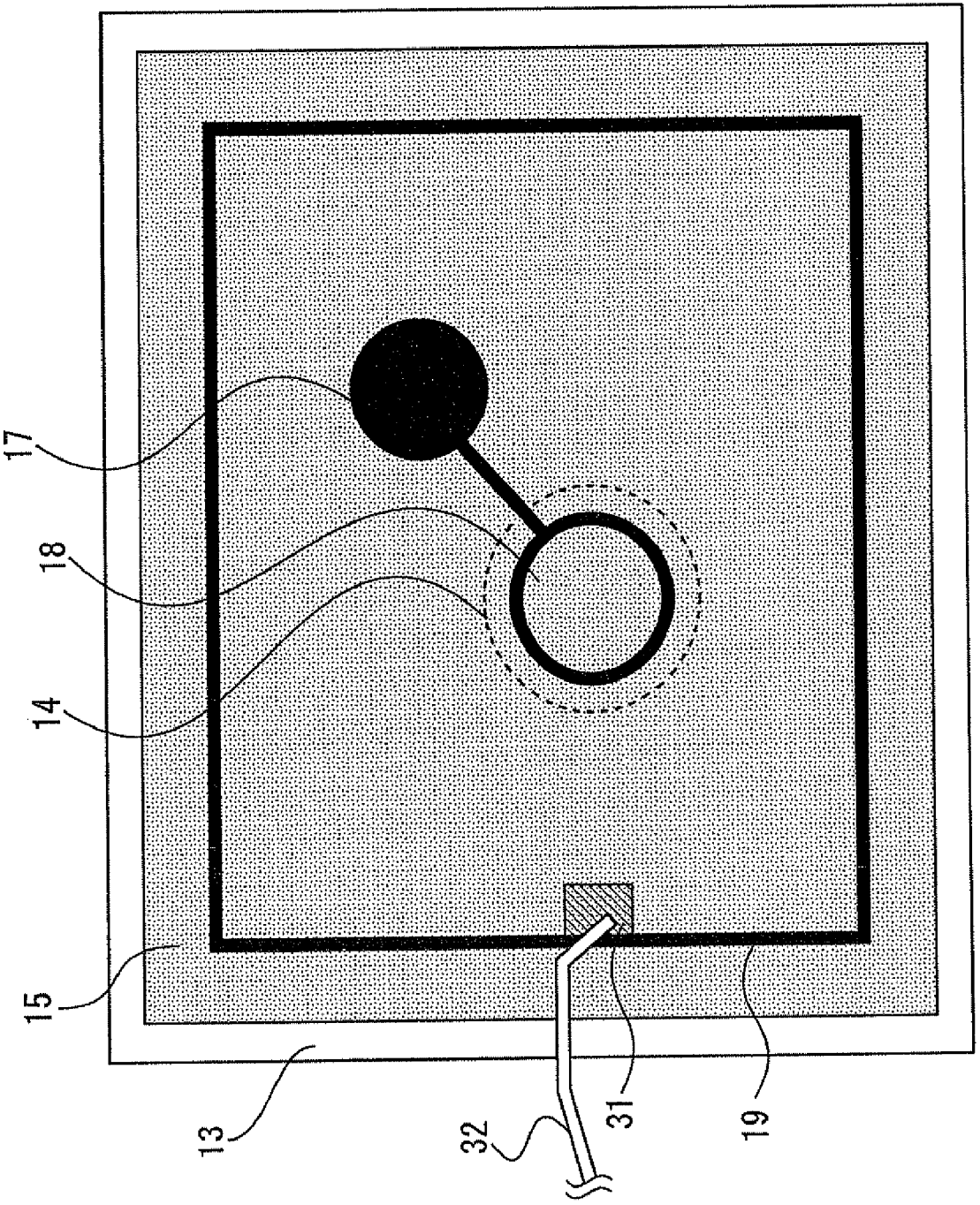
FIG. 6 is a top view showing an optical semiconductor device according to Embodiment 5 of the present invention.

FIG. 6 is a top view showing an optical semiconductor device according to Embodiment 5 of the present invention. A low-voltage electrode 19 is formed on a surface protection film 15 as a metallic thin film of Ti, Cr, Au or the like. A bonding pad 31 is connected to the low-voltage electrode 19 and a wire 32 is connected to the bonding pad 31. A voltage lower than that of a cathode electrode 16 is applied to the low-voltage electrode 19 through this bonding pad 31 and wire 32. The rest of the configuration is the same as that in Embodiment 1. This allows the low-voltage electrode 19 to attract positive ions on the chip top surface and can prevent degradation even in an atmosphere containing moisture for a longer time.

The low-voltage electrode 19 may also be formed below the surface protection film 15. In this case, a part or the whole of the surface protection film 15 on the low-voltage electrode 19 may be removed so that the low-voltage electrode 19 is exposed. Furthermore, the low-voltage electrode 19 may also be formed of not a metallic material but a diffusion region with a p-type dopant implanted into the surface of an n-type InP layer 13. Furthermore, in FIG. 6, the entire perimeter of the anode electrode 17 is surrounded by the low-voltage electrode 19, but a similar effect may also be obtained by not necessarily surrounding the entire perimeter.

Embodiment 6

Figure 7:
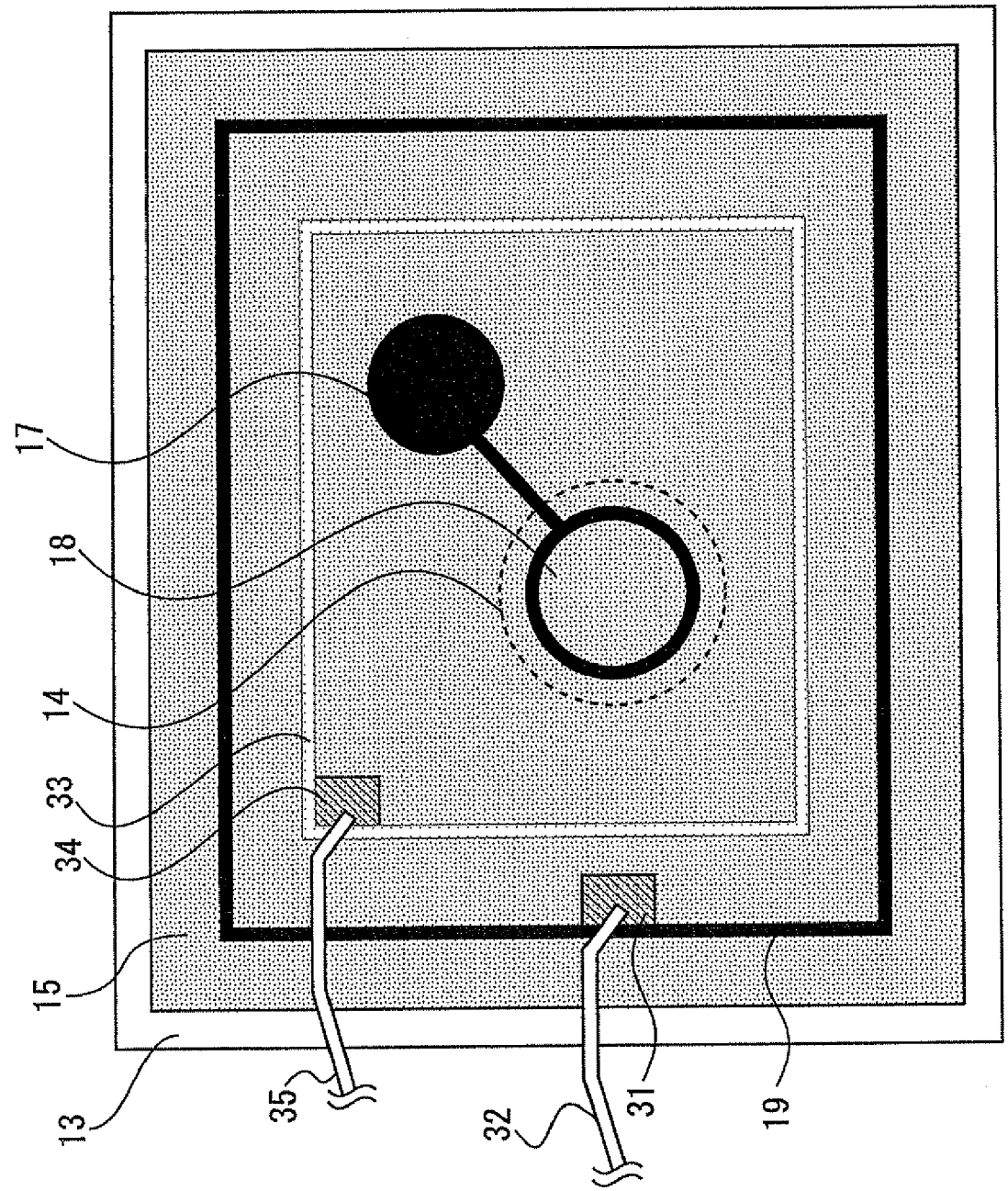
FIG. 7 is a top view showing an optical semiconductor device according to Embodiment 6 of the present invention.

FIG. 7 is a top view showing an optical semiconductor device according to Embodiment 6 of the present invention. A high-voltage electrode 33 is arranged between a low-voltage electrode 19 and an anode electrode 17 so as to surround the anode electrode 17. This high-voltage electrode 33 is formed on a surface protection film 15 as a metallic thin film of Ti, Cr, Au or the like. A bonding pad 34 is connected to the high-voltage electrode 33 and a wire 35 is connected to the bonding pad 34. A voltage higher than those of the anode electrode 17 and the low-voltage electrode 19 is applied to the high-voltage electrode 33 through this bonding pad 34 and wire 35. The rest of the configuration is the same as that in Embodiment 5.

Figure 8:
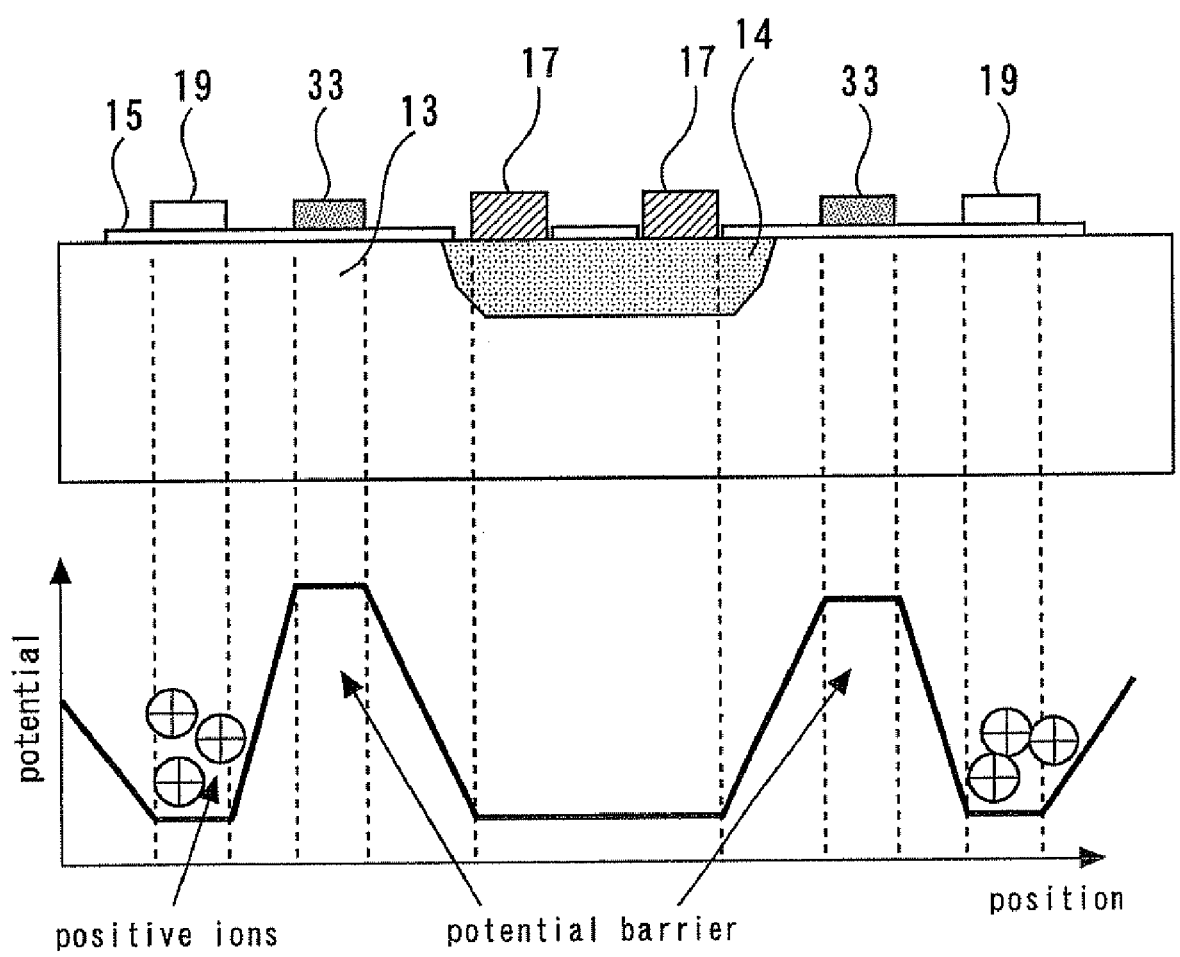
FIG. 8 shows a cross-sectional view and a potential distribution of FIG. 7.

FIG. 8 shows a cross-sectional view and a potential distribution of FIG. 7. As shown in the figure, adopting an M-shaped potential causes a potential barrier to be formed around the anode electrode 17 in the center, preventing positive ions from approaching the anode electrode 17. This can prevent degradation even in an atmosphere containing moisture for a longer time. Though there is no high-voltage electrode 33 in Embodiment 5, the surface protection film 15 contacts the n-type InP layer 13, which increases the potential of the part corresponding to the high-voltage electrode 33 and has a similar effect.

Embodiment 7

Figure 9:
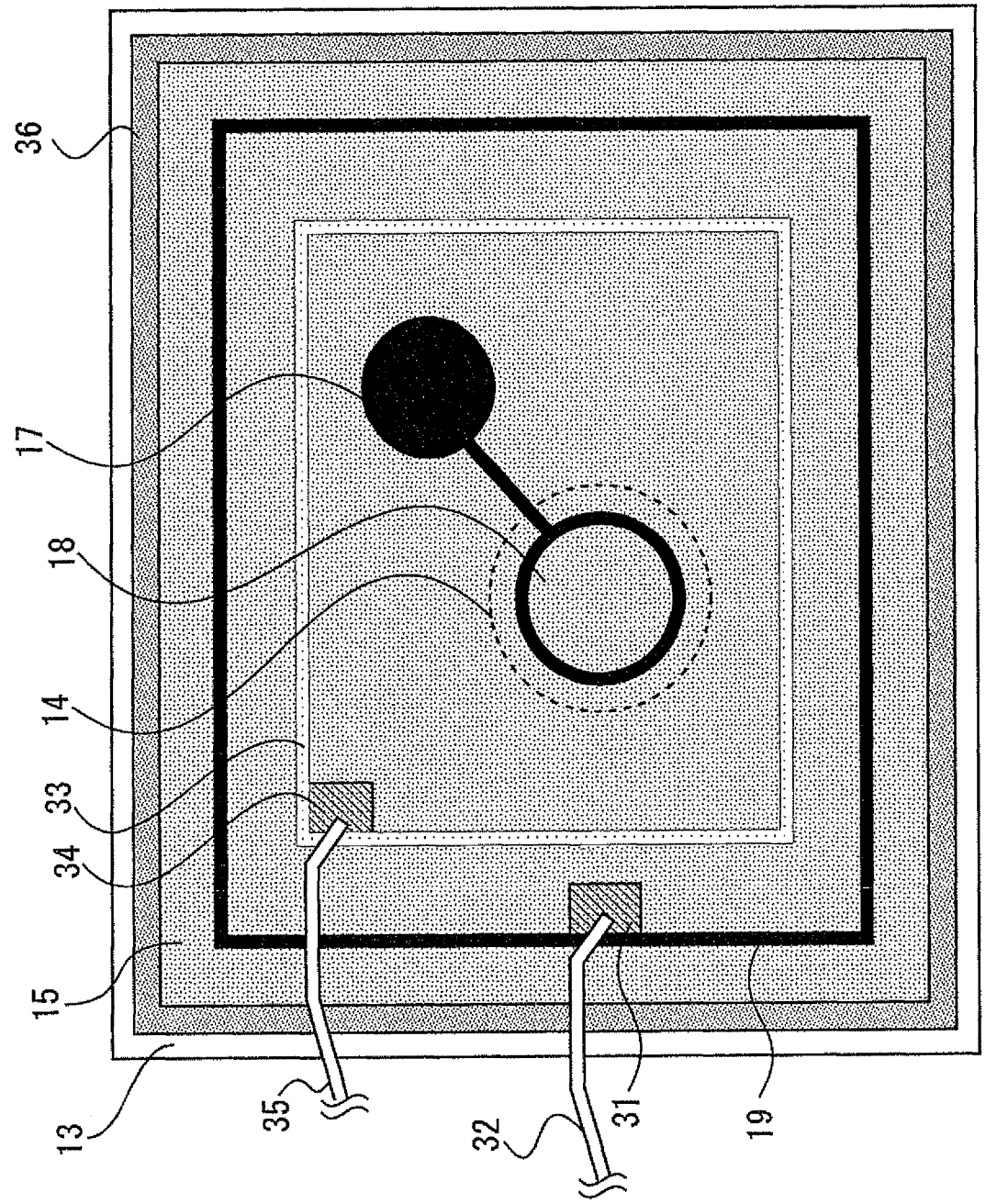
FIG. 9 is a top view showing an optical semiconductor device according to Embodiment 7 of the present invention.

FIG. 9 is a top view showing an optical semiconductor device according to Embodiment 7 of the present invention. The edges of a surface protection film 15 are covered with a metallic film 36. The rest of the configuration is the same as that in Embodiment 6.

By covering the boundary between the edges of the surface protection film 15 and the n-type InP layer 13 with the metallic film 36, it is possible to prevent moisture and charged ions from infiltrating underneath the surface protection film 15. Therefore, it is possible to prevent discoloration and degradation which advance from the edges of the surface protection film 15.

Embodiment 8

Figure 10:
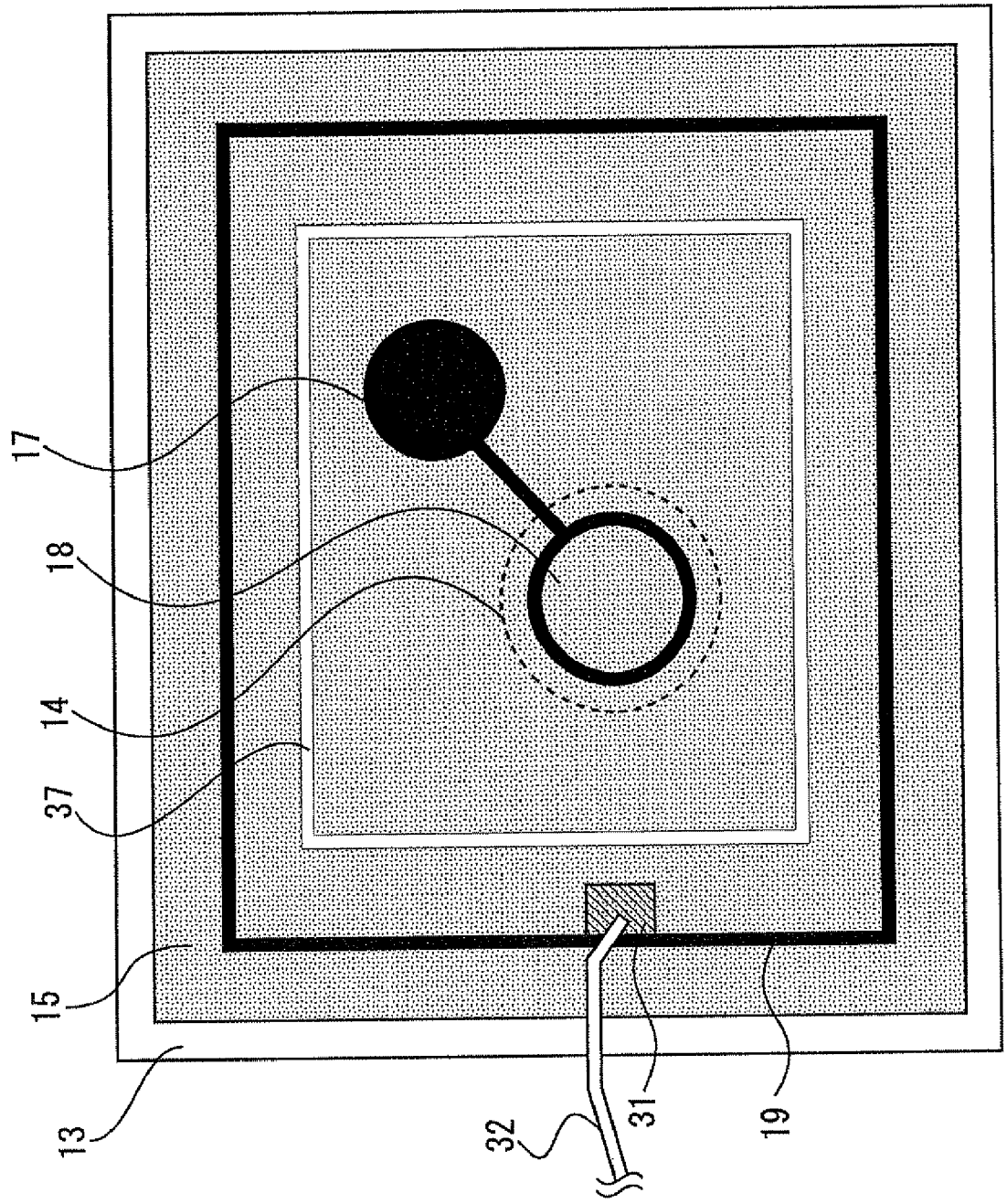
FIG. 10 is a top view showing an optical semiconductor device according to Embodiment 8 of the present invention.

FIG. 10 is a top view showing an optical semiconductor device according to Embodiment 8 of the present invention. A surface protection film 15 is provided with an opening 37 between a low-voltage electrode 19 and an anode electrode 17 so as to surround the anode electrode 17. Through this opening 37, an n-type InP layer 13 is exposed which has a voltage higher than that of the low-voltage electrode 19. The rest of the configuration is the same as that in Embodiment 5.

Providing the opening 37 prevents positive ions from approaching the anode electrode 17 as in the case of Embodiment 6. Forming a metallic thin film so as to cover the opening 37 can prevent moisture and charged ions from infiltrating underneath the surface protection film 15.

Embodiment 9

Figure 11:
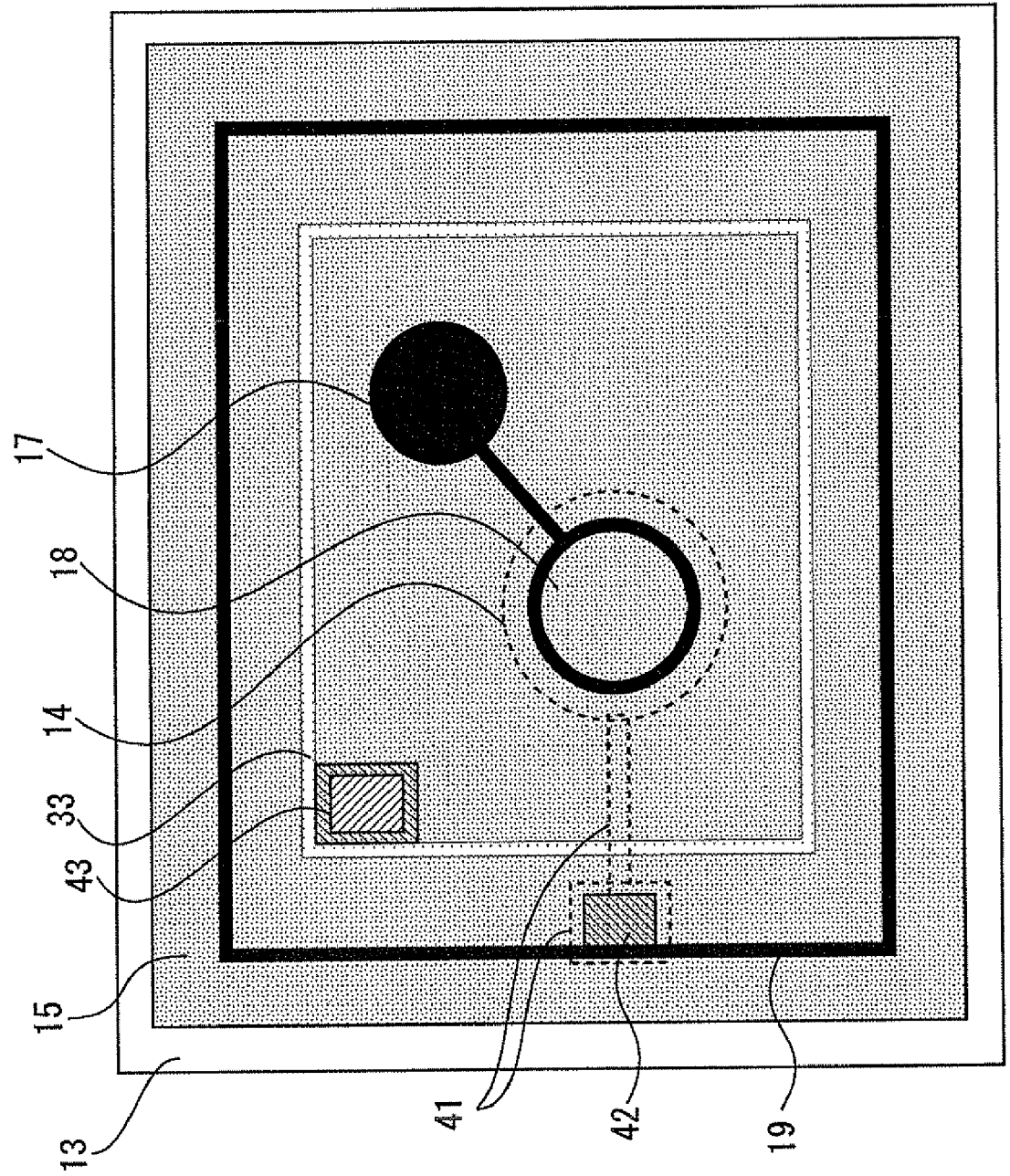
FIG. 11 is a top view showing an optical semiconductor device according to Embodiment 9 of the present invention.

FIG. 11 is a top view showing an optical semiconductor device according to Embodiment 9 of the present invention. A p-type diffusion region 41 is formed on the surface of an n-type InP layer 13 and this p-type diffusion region 41 is electrically connected to a p-type InP region 14. A surface protection film 15 is partially removed and contact electrodes 42, 43 are formed. A low-voltage electrode 19 is electrically connected to the p-type InP region through the contact electrode 42 and the p-type diffusion region 41. A high-voltage electrode 33 is electrically connected to the n-type InP layer 13 through the contact electrode 430 This configuration eliminates the necessity for supplying power to the low-voltage electrode 19 and the high-voltage electrode 33 from outside.

Making the p-type diffusion region 41 thinner or shallower so as to have higher resistance can prevent a high frequency signal produced at a light receiving section 18 from leaking out to the low-voltage electrode 19. Furthermore, instead of using the contact electrodes 42, 43, the whole low-voltage electrode 19 and high-voltage electrode 33 may also be electrically connected to the p-type diffusion region 41 and n-type InP layer 13 respectively.

Embodiment 10

Figure 12:
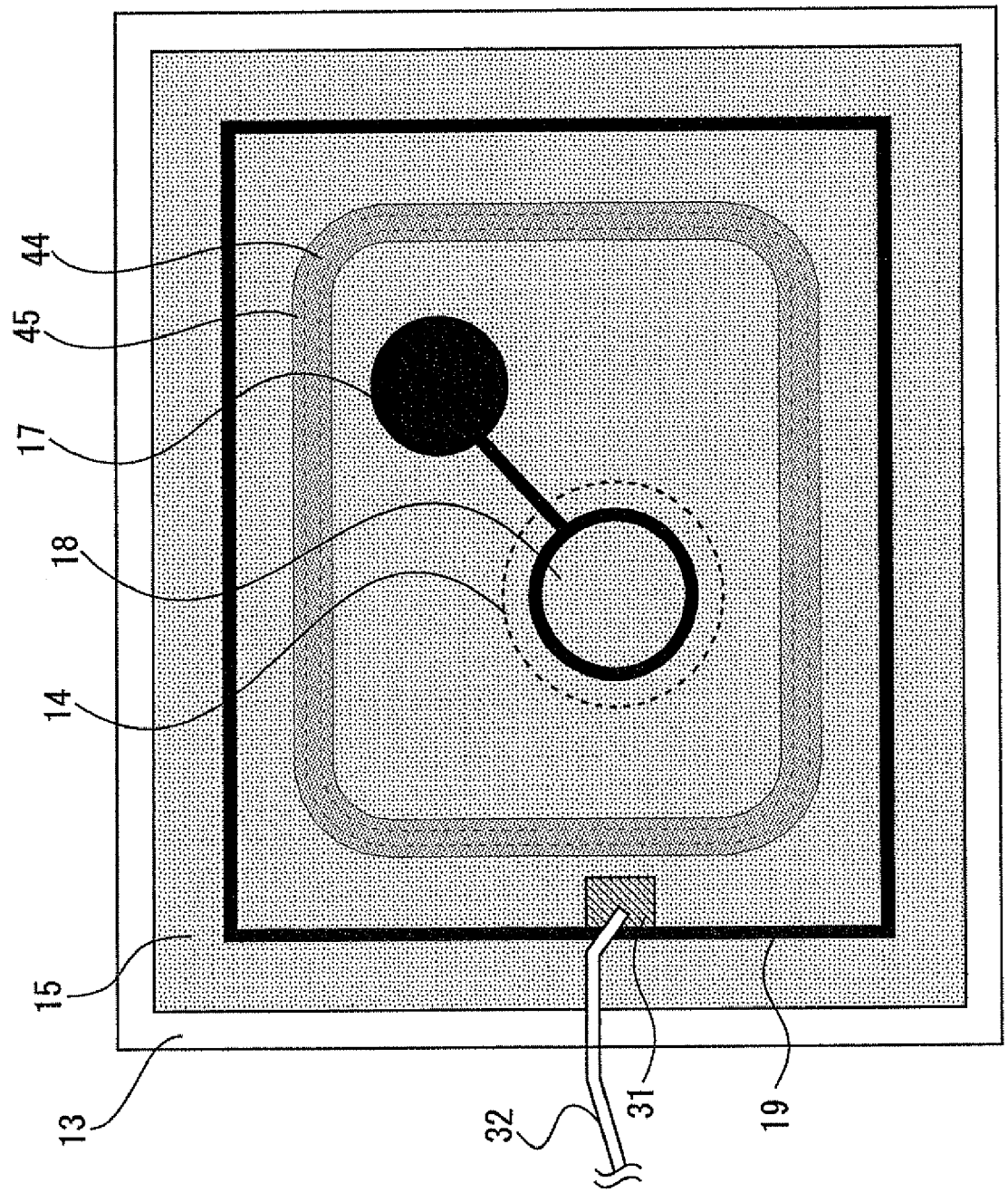
FIG. 12 is a top view showing an optical semiconductor device according to Embodiment 10 of the present invention.

FIG. 12 is a top view showing an optical semiconductor device according to Embodiment 10 of the present invention. A groove 44 is formed on the surface of an n-type InP layer 13 between a low-voltage electrode 19 and an anode electrode 17 so as to surround the anode electrode 17. A metallic film 45 for covering this groove 44 is formed on a surface protection film 15. The rest of the configuration is the same as that in Embodiment 5.

The groove 44 can provide isolation between a light receiving section 18 and the end of the chip. However, the groove 44 provided in the chip surface is easily subject to stress and this stress damages the surface protection film 15 triggering discoloration and degradation from the groove 44. Therefore, by covering the groove 44 with the metallic film 45, it is possible to prevent moisture and charged ions from infiltrating underneath the surface protection film 15.

Embodiment 11

Figure 13:
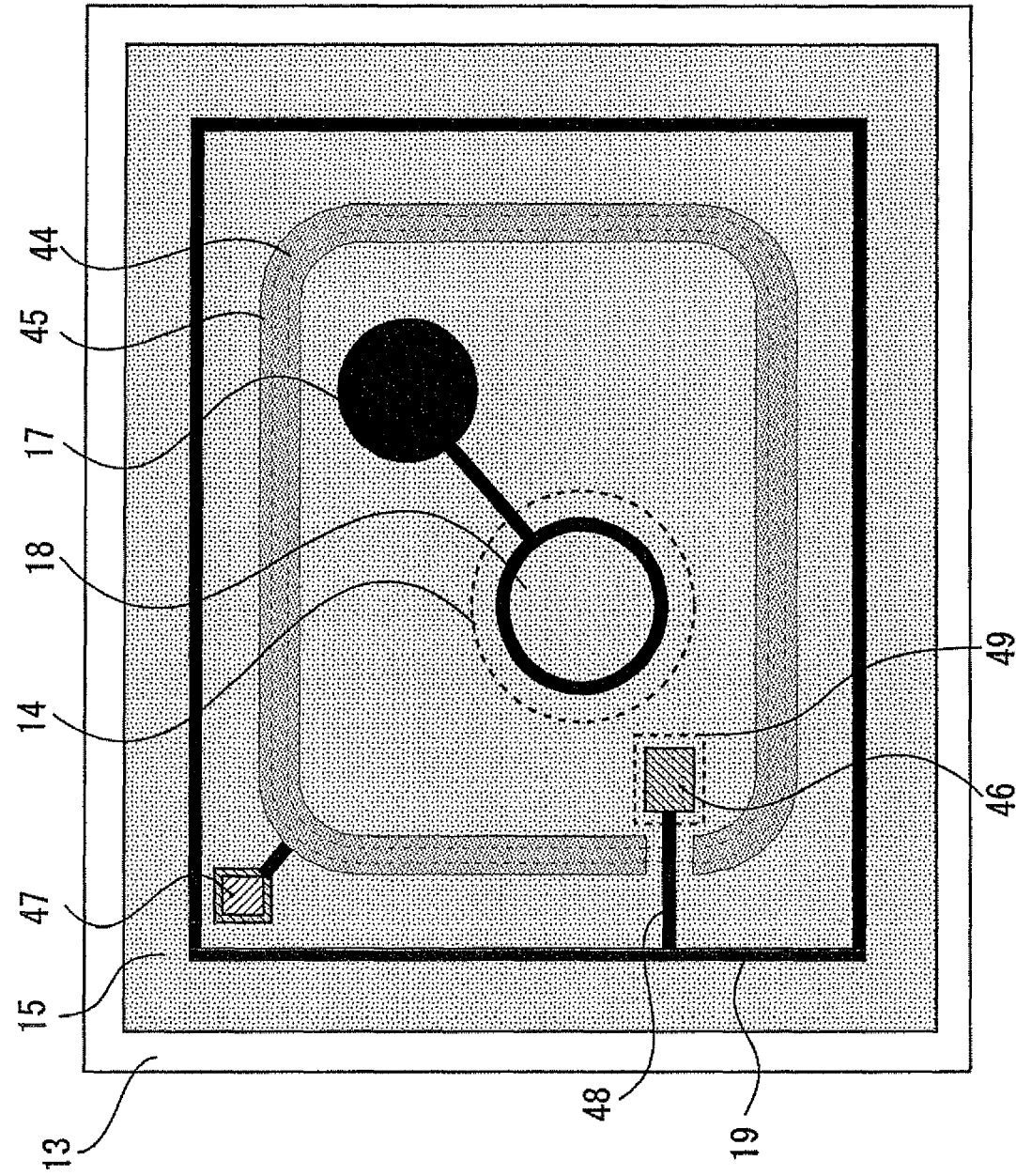
FIG. 13 is a top view showing an optical semiconductor device according to Embodiment 11 of the present invention.

FIG. 13 is a top view showing an optical semiconductor device according to Embodiment 11 of the present invention. A surface protection film 15 is partially removed and contact electrodes 46, 47 are formed. A low-voltage electrode 19 is electrically connected to a p-type diffusion region 49 inside a groove 44 through the contact electrode 46 and a wiring 48. A metallic film 45 is electrically connected to an n-type InP layer 13 outside the groove 44 through the contact electrode 47. The rest of the configuration is the same as that in Embodiment 10.

In this way, a voltage lower than that of the cathode electrode 16 is applied to the low-voltage electrode 19. Furthermore, a voltage higher than that of the low-voltage electrode 19 is applied to the metallic film 45. Therefore, there is no necessity for supplying power to the low-voltage electrode 19 and metallic film 45 from outside.

The p-type diffusion region 49 may not necessarily be provided. That is, the low-voltage electrode 19 may be electrically connected to an n-type InP layer 13 inside the groove 44 through the contact electrode 46 and the wiring 48. This is because the n-type InP layer 13 inside the groove 44 has a voltage lower than that of the n-type InP layer 13 outside the groove. However, a lower voltage can be obtained with the presence of the p-type diffusion region 49. Furthermore, the p-type diffusion region 49 may be connected to a p-type InP region 14 of a light receiving section 18. In this case, making the joint between the p-type diffusion region 49 and the p-type InP region 14 thinner or shallower so as to have higher resistance can prevent a high frequency signal produced at the light receiving section 18 from leaking out to the low-voltage electrode 19.

Embodiment 12

Figure 14:
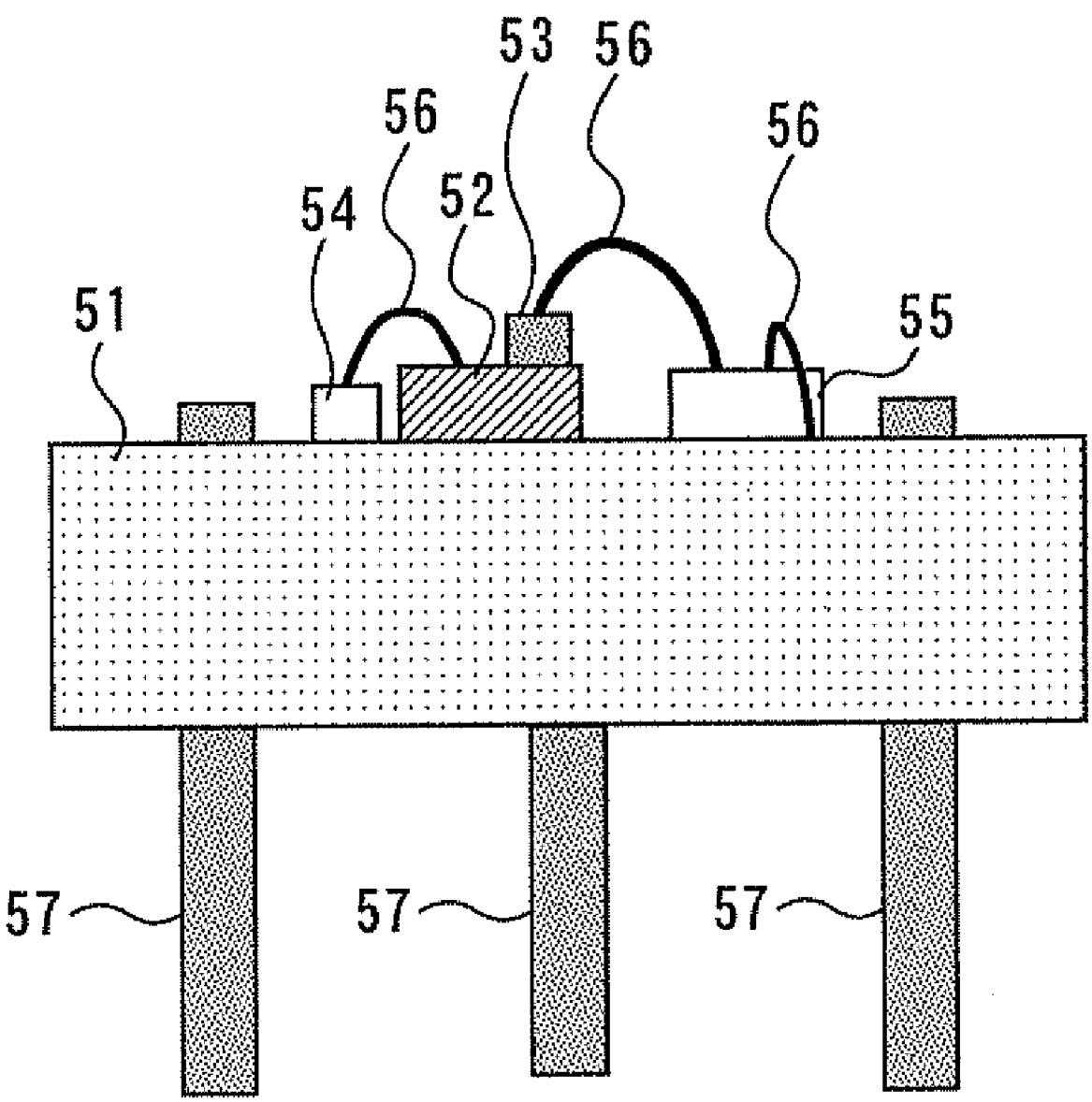
FIG. 14 is a side view showing an optical semiconductor device according to Embodiment 12 of the present invention.

FIG. 14 is a side view showing an optical semiconductor device according to Embodiment 12 of the present invention. A chip 53 of the optical semiconductor device is mounted on a stem 51 through an insulative pedestal 52. Other chip parts 54, 55 are also mounted on the stem 51. These are electrically interconnected through a wire 56. Lead terminals 57 go out of the stem 51. Power is supplied to the stem 51 so that the voltage thereof is lower than that of the cathode electrode of the optical semiconductor device.

In this way, positive ions on the stem 51 are attracted to the stem 51 and positive ions attracted to the anode electrode of the optical semiconductor device thereby decrease. Therefore, discoloration and degradation are less likely to occur and it is thereby possible to improve the anti-moisture property.

Embodiment 13

Figure 15:
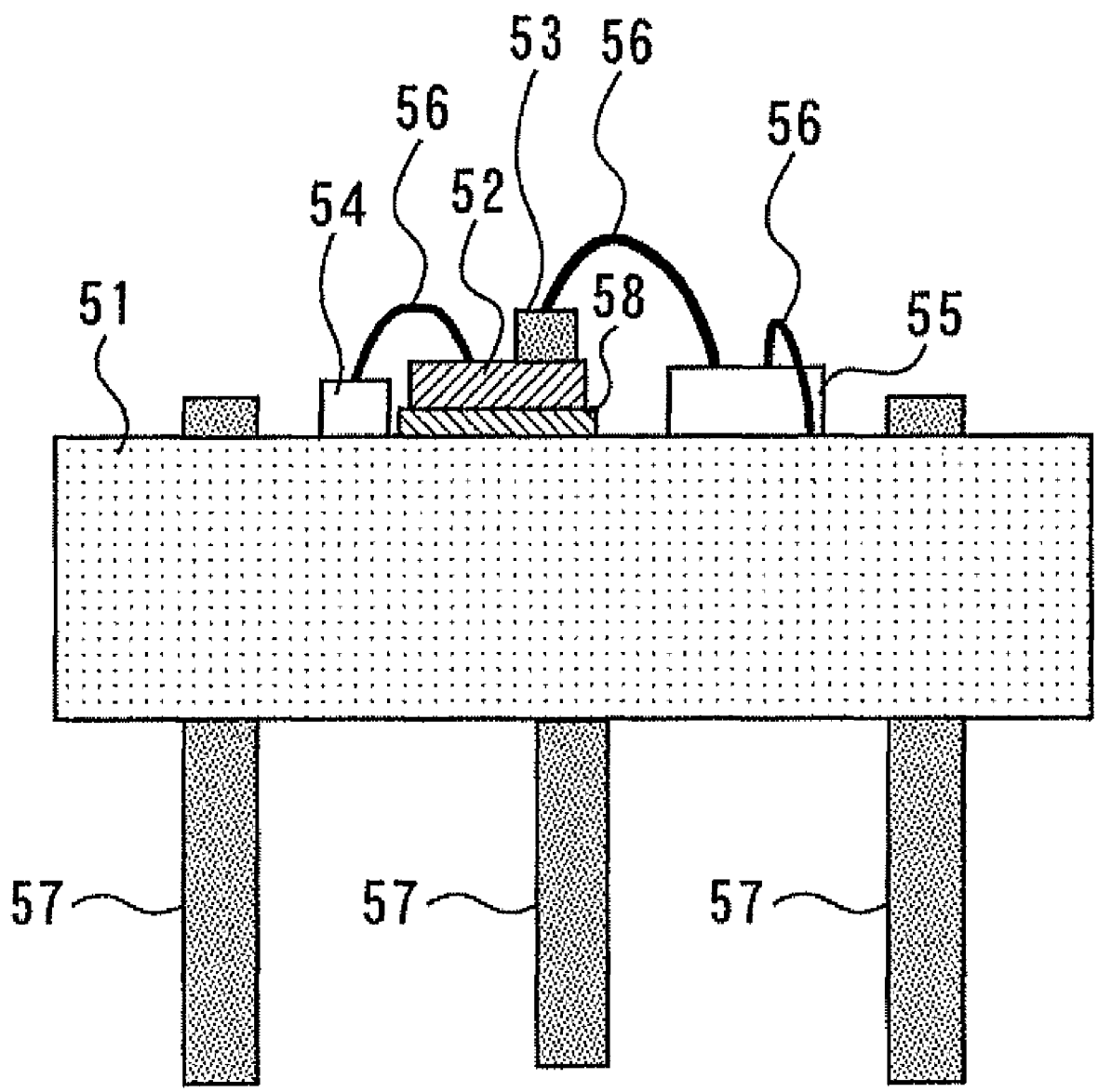
FIG. 15 is a side view showing an optical semiconductor device according to Embodiment 13 of the present invention.

FIG. 15 is a side view showing an optical semiconductor device according to Embodiment 13 of the present invention. An insulative pedestal 58 whose top surface is covered with an electrode metal is provided between a stem 51 and a pedestal 52. Power is supplied to the top surface of the pedestal 58 so as to have a voltage lower than that of a cathode electrode of the optical semiconductor device. The rest of the configuration is the same as that in Embodiment 12.

In this ways positive ions on the stem 51 are attracted to the pedestal 58 and positive ions attracted to the anode electrode of the optical semiconductor device thereby decrease. Therefore, discoloration and degradation are less likely to occur and it is thereby possible to improve the anti-moisture property.

Embodiment 14

Figure 16:
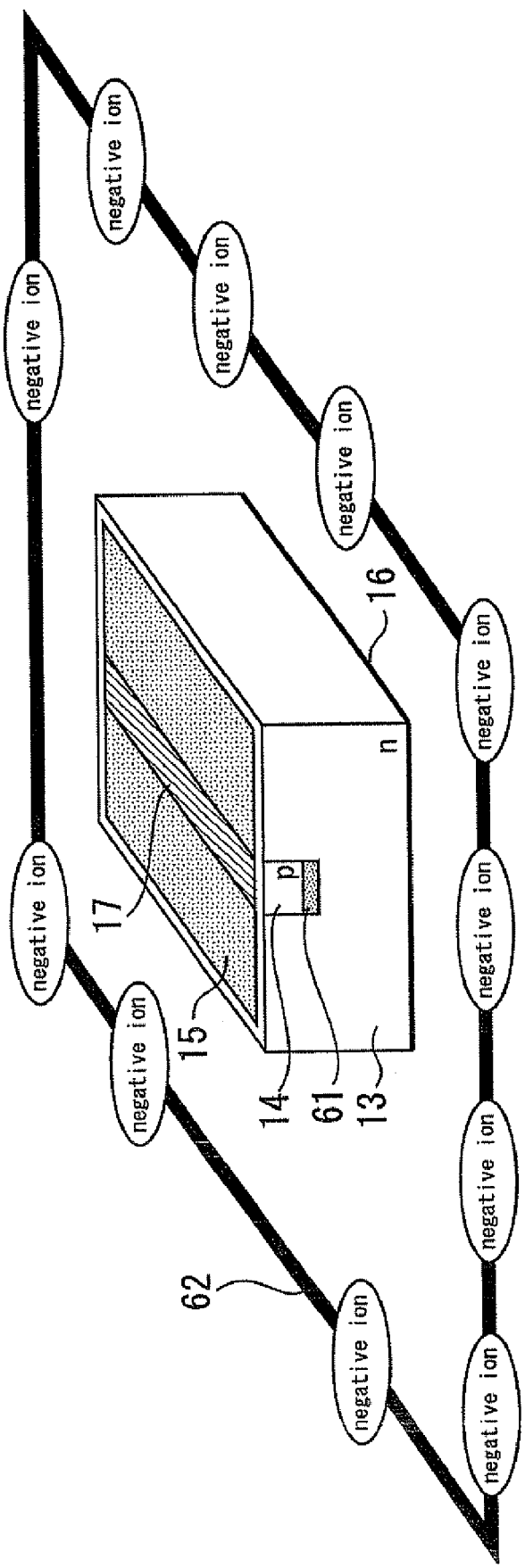
FIG. 16 is a perspective view showing an optical semiconductor device according to Embodiment 14 of the present invention.

FIG. 16 is a perspective view showing an optical semiconductor device according to Embodiment 14 of the present invention. This optical semiconductor device is an end face light emitting type laser diode.

An activated layer 61 is formed in an n-type InP layer 13 (first conductive type semiconductor layer). By selectively diffusing impurities and implanting ions, a p-type InP region 14 (two-conductive type semiconductor region) is formed in a part of the top surface of an n-type InP layer 13. The top surfaces of the n-type InP layer 13 and the p-type InP region 14 are covered with a surface protection film 15. A cathode electrode 16 (first electrode) is connected to the underside of the n-type InP layer 13. An anode electrode 17 (second electrode) is connected to the top surface of the p-type InP region 14. A voltage higher than that of the cathode electrode 16 is applied to this anode electrode 17.

In this embodiment, a high-voltage electrode 62 is arranged so as to surround an anode electrode 17. A voltage higher than that of the cathode electrode 16 is applied to this high-voltage electrode 62. This causes negative ions which exist around the optical semiconductor device to be trapped by the high-voltage electrode 62 and thereby prevents negative ions from gathering around the anode electrode 17. Therefore, discoloration and degradation are less likely to occur and it is thereby possible to improve the anti-moisture property. The above described configuration may be combined with the configurations in Embodiments 2 to 13.

Embodiment 15

Figure 17:
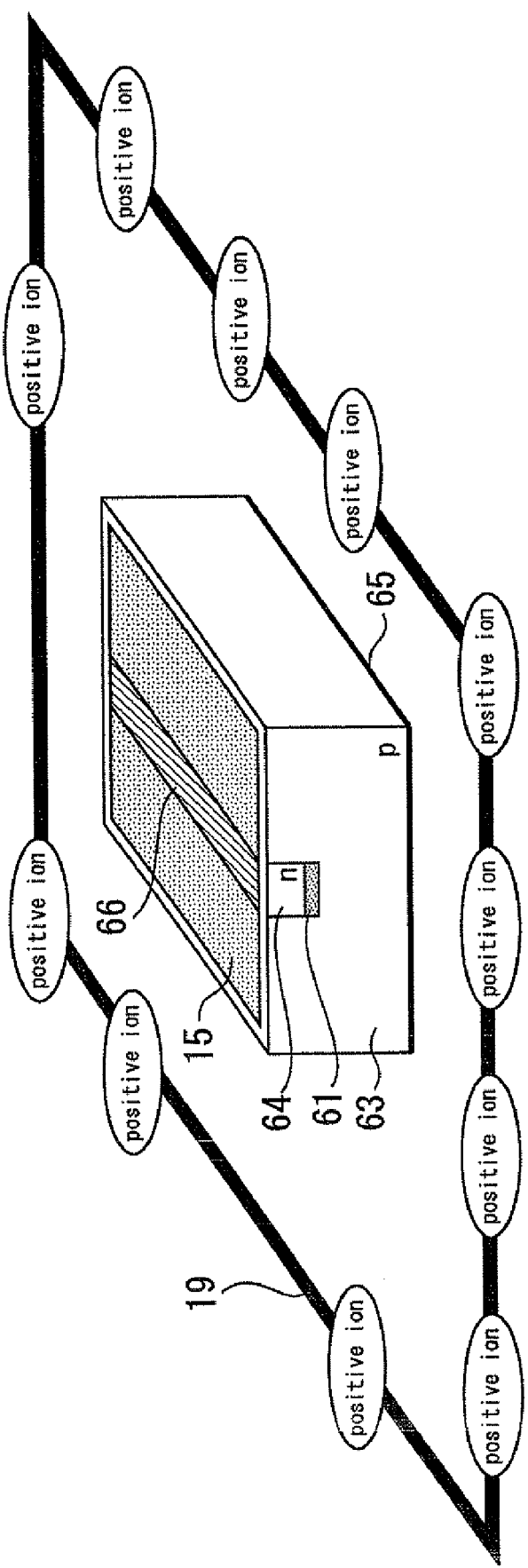
FIG. 17 is a perspective view showing an optical semiconductor device according to Embodiment 15 of the present invention.
Figure 18:
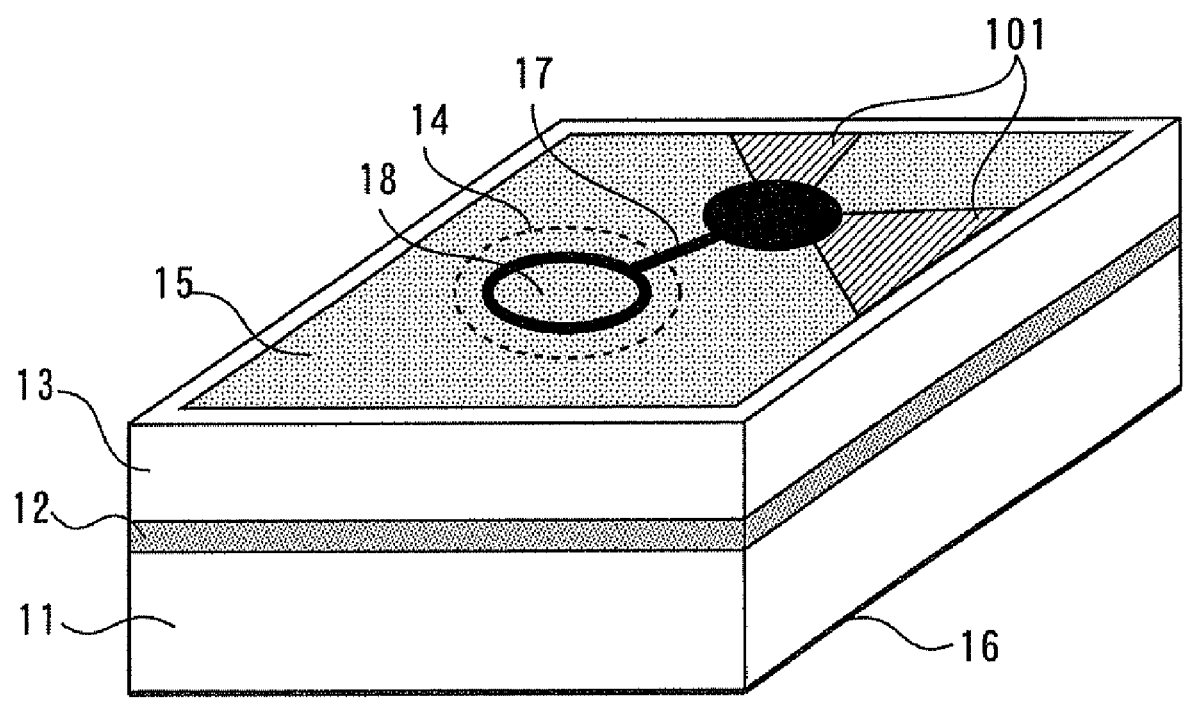
FIG. 18 is a perspective view showing a conventional optical semiconductor device.

FIG. 17 is a perspective view showing an optical semiconductor device according to Embodiment 15 of the present invention. This optical semiconductor device is an end face light emitting type laser diode.

An activated layer 61 is formed in a p-type InP layer 63 (first conductive type semiconductor layer). By selectively diffusing impurities and implanting ions, an n-type InP region 64 (two-conductive type semiconductor region) is formed in a part of the top surface of the p-type InP layer 63. The top surfaces of the p-type InP layer 63 and n-type InP region 64 are covered with a surface protection film 15. An anode electrode 65 (first electrode) is connected to the underside of the p-type InP layer 63. A cathode electrode 66 (second electrode) is connected to the top surface of the n-type InP region 64. A voltage lower than that of the anode electrode 65 is applied to this cathode electrode 66.

In this embodiment, a low-voltage electrode 19 is arranged so as to surround the cathode electrode 66. A voltage lower than that of the anode electrode 65 is applied to this low-voltage electrode 19. This causes positive ions which exist around the optical semiconductor device to be trapped by the low-voltage electrode 19 and thereby prevents positive ions from gathering around the cathode electrode 66. Therefore, discoloration and degradation are less likely to occur and it is thereby possible to improve the anti-moisture property. The above described configuration may be combined with the configurations in Embodiments 2 to 13.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-149591, filed on Jun. 5, 2007 including specification, claims, drawings and summary, on which the Convention priority of the present application is based, are incorporated herein by reference in its entirety.

What is claimed is:

1. An optical semiconductor device comprising:
   a first conductivity type semiconductor layer;
   a second conductivity type semiconductor region located within and at a part of a top surface of the first conductivity type semiconductor layer;

a surface protection film which covers top surfaces of the first conductivity type semiconductor layer and the second conductivity type semiconductor region;

a first electrode connected to the first conductivity type semiconductor layer;

a second electrode connected to the second conductivity type semiconductor region and to which a voltage lower than a voltage of the first electrode is applied; and a low-voltage electrode surrounding the second electrode and to which a voltage lower than the voltage of the first electrode is applied.

2. The optical semiconductor device according to claim 1, wherein the low-voltage electrode is electrically connected to the second electrode.

3. The optical semiconductor device according to claim 2, further comprising a high impedance section connected between the low-voltage electrode and the second electrode, and having an impedance of at least 20Ω.

4. The optical semiconductor device according to claim 1, further comprising a high-voltage electrode located between the low-voltage electrode and the second electrode and surrounding the second electrode and to which a voltage higher than the voltages of the second electrode and the low-voltage electrode is applied.

5. The optical semiconductor device according to claim 1, further comprising a metallic film which covers edges of the surface protection film.

6. The optical semiconductor device according to claim 1, wherein the surface protection film includes an opening between the low-voltage electrode and the second electrode, surrounding the second electrode and exposing the first conductivity type semiconductor layer.

7. The optical semiconductor device according to claim 1, wherein the low-voltage electrode is electrically connected to the second conductivity type semiconductor region.

8. The optical semiconductor device according to claim 4, wherein the high-voltage electrode is electrically connected to the first conductivity type semiconductor layer.

9. An optical semiconductor device comprising:
a first conductivity type semiconductor layer;
a second conductivity type semiconductor region located within and at a part of a top surface of the first conductivity type semiconductor layer;

a surface protection film which covers top surfaces of the first conductivity type semiconductor layer and the second conductivity type semiconductor region;

a first electrode connected to the first conductivity type semiconductor layer;

a second electrode connected to the second conductivity type semiconductor region and to which a voltage lower than a voltage of the first electrode is applied;

a low-voltage electrode surrounding the second electrode and to which a voltage lower than the voltage of the first electrode is applied;

a groove in the surface of the first conductivity type semiconductor layer, between the low-voltage electrode and the second electrode, and surrounding the second electrode; and a metallic film on the surface protection film, covering the groove.

10. The optical semiconductor device according to claim 9, wherein the low-voltage electrode is electrically connected to the first conductivity type semiconductor layer or the second conductivity type semiconductor region inside the groove.

11. The optical semiconductor device according to claim 9, wherein the metallic film is electrically connected to the first conductivity type semiconductor layer outside the groove.

12. An optical semiconductor device comprising:
a first conductivity type semiconductor layer;
a second conductivity type semiconductor region within and at a part of a top surface of the first conductivity type semiconductor layer;
a surface protection film which covers top surfaces of the first conductivity type semiconductor layer and the second conductivity type semiconductor region;
a first electrode connected to the first conductivity type semiconductor layer;
a second electrode which is connected to the second conductivity type semiconductor region and a voltage higher than a voltage of the first electrode is applied; and
a high-voltage electrode surrounding the second electrode and to which a voltage higher than the voltage of the first electrode is applied.

* * * * *